US 6,748,336 B2

(12) United States Patent
Li

(10) Patent No.: US 6,748,336 B2
(45) Date of Patent: Jun. 8, 2004

(54) METHOD AND APPARATUS FOR PULSE TEMPLATE MATCHING

(75) Inventor: Xuye Li, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 09/751,260

(22) Filed: Dec. 29, 2000

(65) Prior Publication Data

US 2002/0085760 A1 Jul. 4, 2002

(51) Int. Cl.[7] ................................................ G06K 9/62
(52) U.S. Cl. ........................................ 702/67; 382/209
(58) Field of Search ............................. 702/67, 57, 58, 702/59, 46, 69, 72, 106, 182, 183, 184, 185, 190; 382/181, 209, 217, 218; 324/676, 674, 718

(56) References Cited

U.S. PATENT DOCUMENTS 5,418,820 A  * 5/1995 Wincn ......................... 375/340
6,115,113 A  * 9/2000 Flockencier ................ 358/5.01
6,556,621 B1 * 4/2003 Richards et al. ............ 375/150

* cited by examiner

*Primary Examiner*—Marc S. Hoff
*Assistant Examiner*—Edward Raymond
(74) *Attorney, Agent, or Firm*—Blakely, Sokoloff, Taylor & Zafman LLP

(57) ABSTRACT

In one embodiment a visual representation of a pulse shape is created. points of the visual representation of the pulse shape are moved to correspond to a representation of an ideal pulse. Pulse shape coefficient registers are updated to represent the visual representation of the pulse shape such that the pulse shape is adjusted to correspond to the pulse template.

34 Claims, 5 Drawing Sheets

METHOD AND APPARATUS FOR PULSE TEMPLATE MATCHING

FIELD OF THE INVENTION

The present invention relates to the field of signal communications.

BACKGROUND

Communications across signal lines such as those that comply with T1/E1 require that the signal pulse shape conform to a certain standard such as ANSI T1.403 or ANSI T1.102. Typically a measurement device such as an oscilloscope is used to measure the quality of the pulse shape of signals to be sent and determine whether the pulse shape meets the requirement of a pulse template indicative of the signal standard. Some communication products such as the IXF3461 Communications Company manufactured by Intel Corporation include coefficient registers that enable a programmer to modify the pulse shape by modifying the coefficients stored in the registers so that the pulse shape can be conformed to the pulse shape template.

DETAILED DESCRIPTION

In the following description for purposes of explanation numerous details are set forth in order to provide a thorough understanding of the present invention. However, it will be apparent to one skilled in the art that these specific details are not required in order to practice the present invention. In other instances well known electrical structures and circuits are shown in block diagram form in order not to obscure the present invention unnecessarily.

Figure 1A:
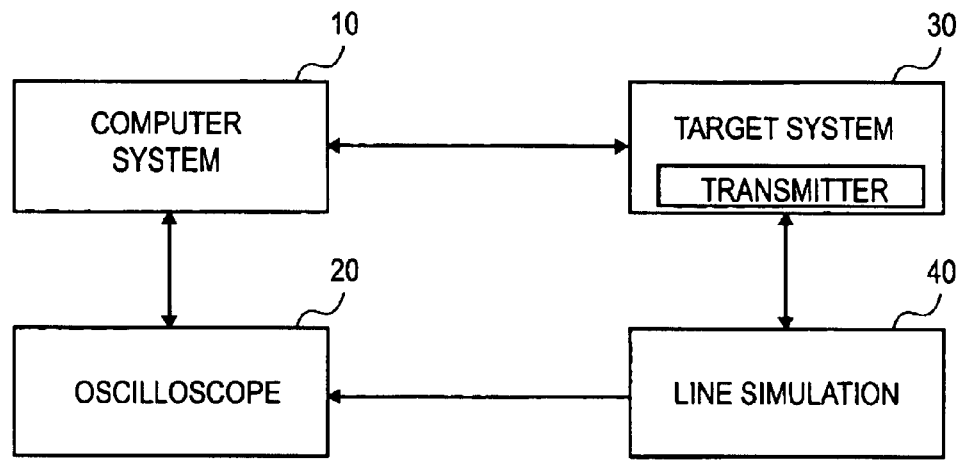
FIG. 1A illustrates one embodiment of a system which operates in accordance with the teaching of the present invention.

FIG. 1A illustrates one embodiment of a system that operates in accordance with the teaching of the present invention. This system includes a computer system 10, an oscilloscope 20, target system 30, and line simulator 40.

The computer system 10 maybe a variety of types of systems including personal computers, workstations and the like. The computer system 10, in one embodiment, generates the graphical user interface that enables the user to modify the pulse shape. The system provides a visual correlation between coefficient registers and signal shape as well as, alternatively or additionally, an automatic coefficient register adjustment.

The oscilloscope 20 measures the signal on the line 40 that is transmitted by target system 30. A variety of oscilloscopes known to those skilled in the art may be used to perform the measurements describes herein. In an alternate embodiment, the oscilloscope further generates the graphical user interface which enables the user to modify the pulse shape. The target system 30 is built on a system that transmits the signals to be measured such as the T1 or E1 signals. Alternately, the applicable elements including the signal transmitter 35 may be incorporated into the oscilloscope 20 or computer system 10.

The signal transmitter 35 utilized includes programmable pulse shaping to enable the pulse to be shaped to a desired pulse shape such as those specified by the signal standards. One such example is the Intel IXF3461 component which has coefficient registers that control the pulse shape such that signals having a specified pulse shape can be generated. As is discussed below, in one embodiment a desired pulse shape is generated from the pulse shape measured on line simulator 40 as modified in accordance with a specified pulse template. The coefficient registers are updated with values to modify the pulse shape of the signals generated. The transmitter circuit 35 may have an arbitrary transmit wave form generator (ATWG) that provides the programmable output pulse shaping. When using the ATWG the desired words, for example 8 bit words, that are the register coefficients are loaded into the memory of the transmitter. The transmitter then uses those register coefficients values to generate shapes of the signal pulses. For example, the register coefficient value function as control points from which line estimation processes can be applied to generate the pulse shape.

For purposes of discussion herein, the term register coefficients include data that is used to generate signals of a corresponding pulse shape. Furthermore, the coefficients are not limited as stored in registers; storage elements include volatile and nonvolatile memory as well as other types of storage elements.

The line simulation component 40 may be a system or device that receives the transmitted signal pulse and provides simulated line effects onto the pulse. Alternately, the line simulation component 40 may be a real wire connection and therefore the signal is simply transmitted across the wire to experience the effects on the signal.

Figure 1B:
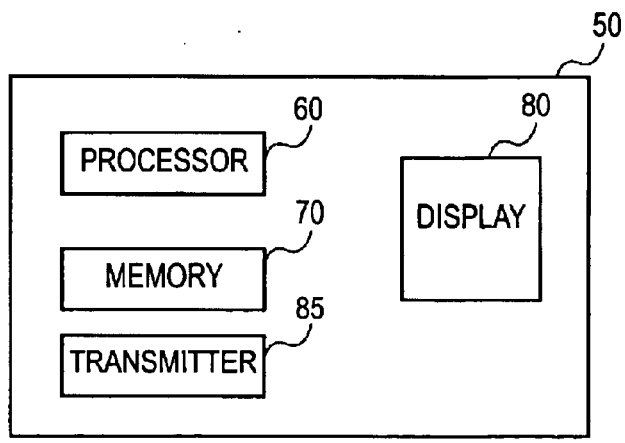
FIG. 1B illustrates an alternate embodiment that operates in accordance with the teachings of the present invention.

FIG. 1B illustrates an alternate embodiment in which the functionality described above is incorporated into a computer system 50 that in one embodiment includes a processor 60, memory 70, display 80 and transmitter 85.

The transmitter 85 is a signal transmitter such as the Intel IFX34161 component that issues the signals to be measured and modified in accordance with the teachings of the present invention. The processor 60 executes instructions stored in the memory 70 that perform the processes described herein. The display 80 displays pulse signal information including a graphical user interface that enables the user to modify the pulse shape to correspond to a desired pulse shape. The memory 70 represents a variety of types of memory and storage systems to enable the storage of data instructions for execution by the processor 60 and including storage of coefficient storage element values representative of the pulse shape used by transmitter 85 for transmission of the desired signal pulse output.

Figure 2:
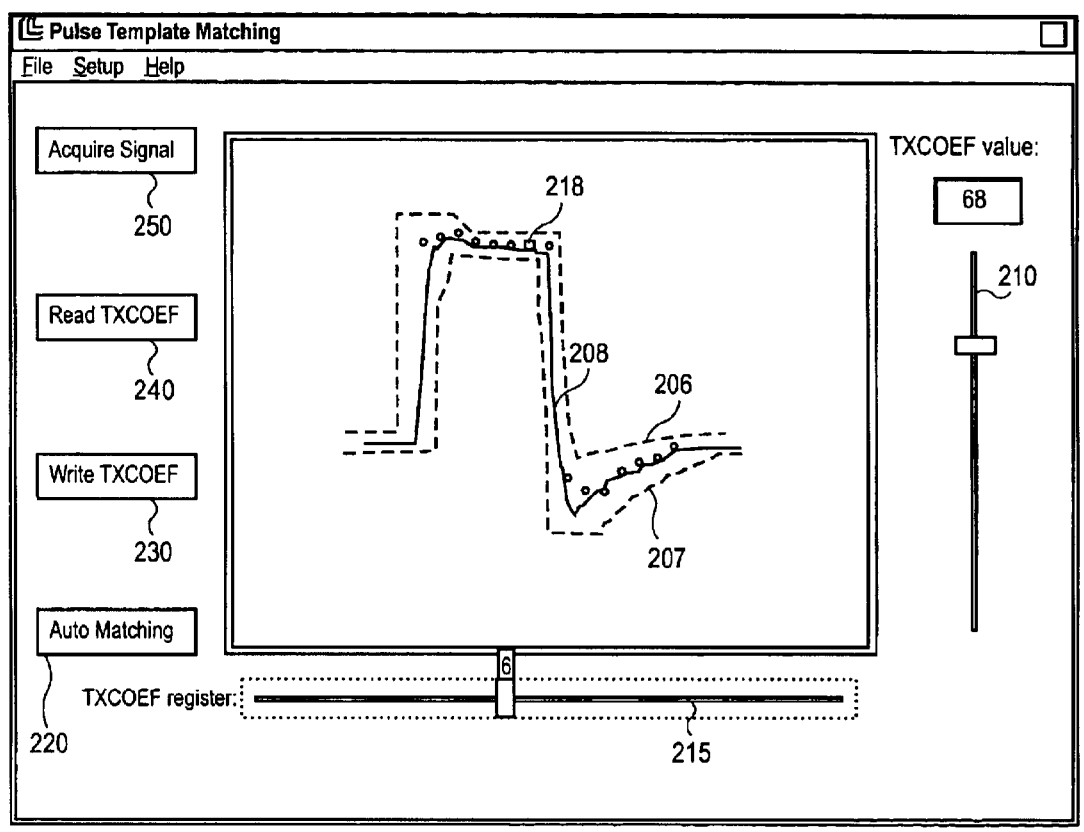
FIG. 2 is an exemplary user interface which is used in accordance with one embodiment of the present invention.

One embodiment of the present invention is illustrated in FIG. 2. FIG. 2 is a representation of a graphical user interface (GUI) that enables the user to visually modify the coefficient storage element or coefficient values that correlate to the pulse shape of a received signal. In the embodiment shown by FIG. 2 the graphical user interface includes the signal display area 205, vertical slider 210, horizontal slider 215 and control buttons 220, 230, 240, and 250. The graphical user interface is not limited to the sliders and buttons shown; it is contemplated that a variety of GUI input/output elements may be used to perform the functionality discussed herein.

The signal display area 205 displays signal information that enables a user to modify the shape of the signal pulse using the processes described herein. In the embodiment illustrated by FIG. 2, the signals displayed in area 205 include the pulse template 206, 207 and the pulse signal shape 208. The pulse template is representative of an acceptable pulse shape, e.g., one that complies which a particular signal transmission standard. In the embodiments shown in FIG. 2, the template is formed of two pulse shapes indicative of a range of acceptable values. As will be referred to below, an ideal pulse is utilized by embodiments of processes described herein to match the pulse shape. In one embodiment, the ideal pulse is simply a pulse shape that is center to the pulse template, i.e., midway to pulse shapes 206, 207. The acquire signal button 250 acquires the signal for pulse shape modification; thus in one embodiment a signal would be received from a line connected to the transmitter device and the applicable coefficient storage elements, for example, coefficient registers or memory, located on the computer system, for example, are loaded. The values stored in coefficient storage elements are used to generate the pulse signal shape. For example, the values may be control points along the signal shape. Alternately, the values may configured for use by other processes to generate the pulse signal shape. The number of storage elements, for example, registers, utilized may vary according to the application and the hardware and/or software used. For example, in one embodiment, 15 storage elements are used for a standard T1 connection, 8 for an E1 connection (a standard like T1). The read TXCOEF button 240 reads out the coefficient storage element values. The write TXCOEF button 230 when selected writes corresponding storage element coefficient values to the storage elements (e.g. coefficient registers)and generates a pulse signal representation, for example, pulse signal shape 260. In one embodiment, the value written to a selected storage element is used to generate the displayed pulse signal shape e.g., pulse signal shape 260 which may have been modified graphically using, for example, a touch screen or similar input device to change the registers referenced to generate the shape of the pulse displayed. Thus, in one embodiment writing to a register forms a new signal shape and reading from a register may be used for determining status and performing more analysis.

Alternately, the values written to the coefficient storage elements are based upon the values selected using the vertical slider 210. The vertical slider 210 may be used to modify the amplitude of the pulse shape. Thus, for example, the horizontal slider 215 is used to select a particular coefficient storage element (Coefficient storage element 6 is shown as selected in FIG. 2). The vertical slider 210 may then be used to modify amplitude of the corresponding point 216 of the pulse shape 208. The displayed value, in this example a value of 70 is displayed, may identify the amplitude in predetermined units. Alternately, the displayed value may be used to determine the actual amplitude.

The visual representation may be changed automatically upon movement of the vertical slider 210 or may be changed after selection of the Write TXCOEF and Read TXCOEF buttons 230, 240, which update the displayed pulse signal shape of the portion of the pulse of corresponding to the modified coefficient signal element.

The auto-match button 220 initiates an auto-matching process in which the input pulse is matched to a pulse template. This will be described further below.

As mentioned above, the user may also select an auto-match function 220 to match the input pulse shape to a pulse template representative of an "ideal" pulse shape. The pulse template in one embodiment includes a desired pulse shape, an ideal pulse shape, and a selectable pulse shape. In one embodiment, an ideal pulse shape is one that complies with the signal standards, for example ANSI T1. In one embodiment, as illustrated herein, the ideal pulse shape is generated as a curve that is positioned in the center of the pulse template (for example, geometrically centered between the upper 206 and lower 207 templates).

Figure 3:
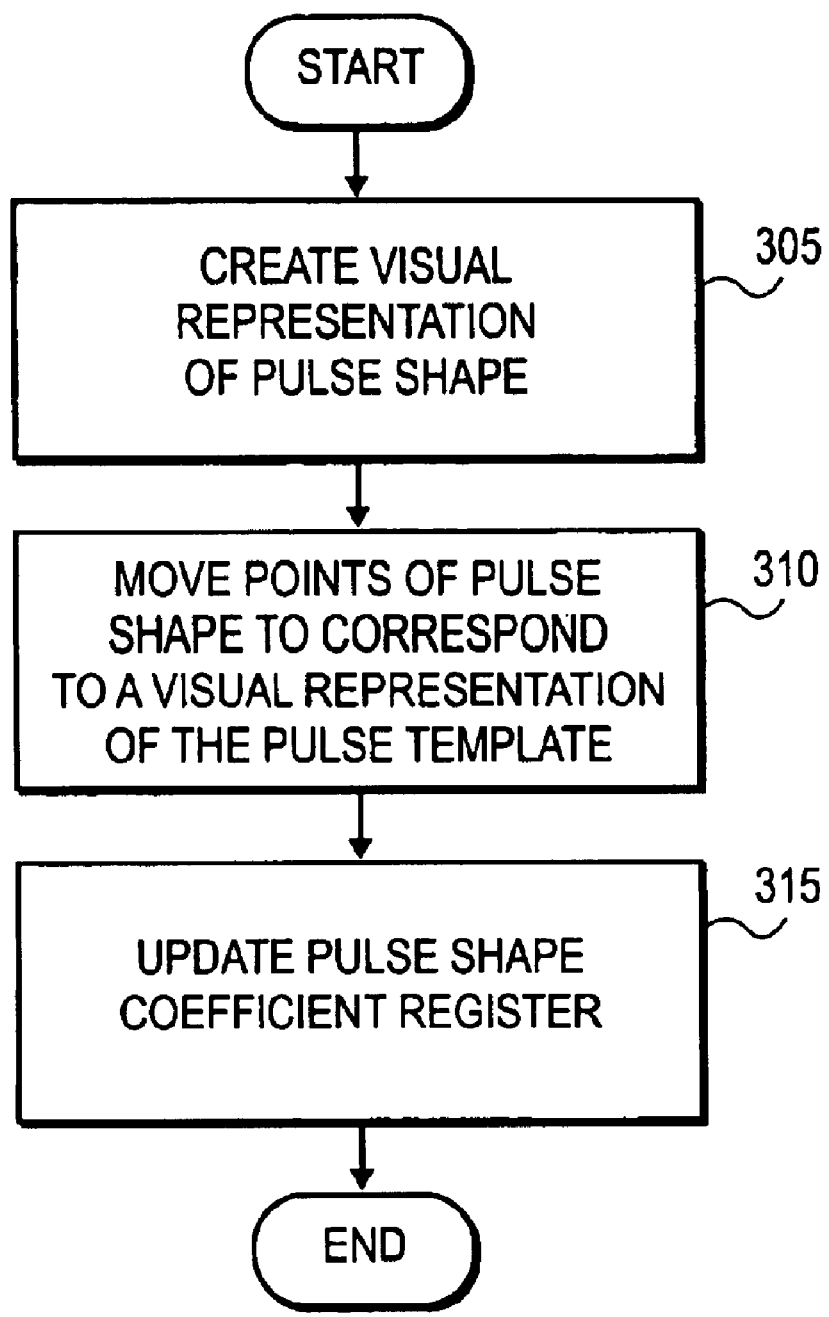
FIG. 3 is a simplified flow diagram of one embodiment of the present invention.

FIG. 3 is a simplified flow diagram of one embodiment of the present invention. A visual representation of the pulse shape is generated and displayed to a user, step 305. The user is then able to move portions or control points of the pulse shape or modify the shape of the pulse to correspond to a visual representation of a pulse template, step 310. In one embodiment, the amplitude of the signal at locations corresponding to the horizontal locations of the coefficients storage elements may be modified.

Once the modifications are made to the user's satisfaction, at step 315, the pulse shape coefficient registers are updated to correspond to the modified pulse shape. In one embodiment, the points are coefficient storage element values used to define the pulse shape. In an alternate embodiment, in which the points are not the storage element values used to define the pulse shape, the coefficient storage elements are updated by interpolating the pulse shape using the points as reference.

Figure 4:
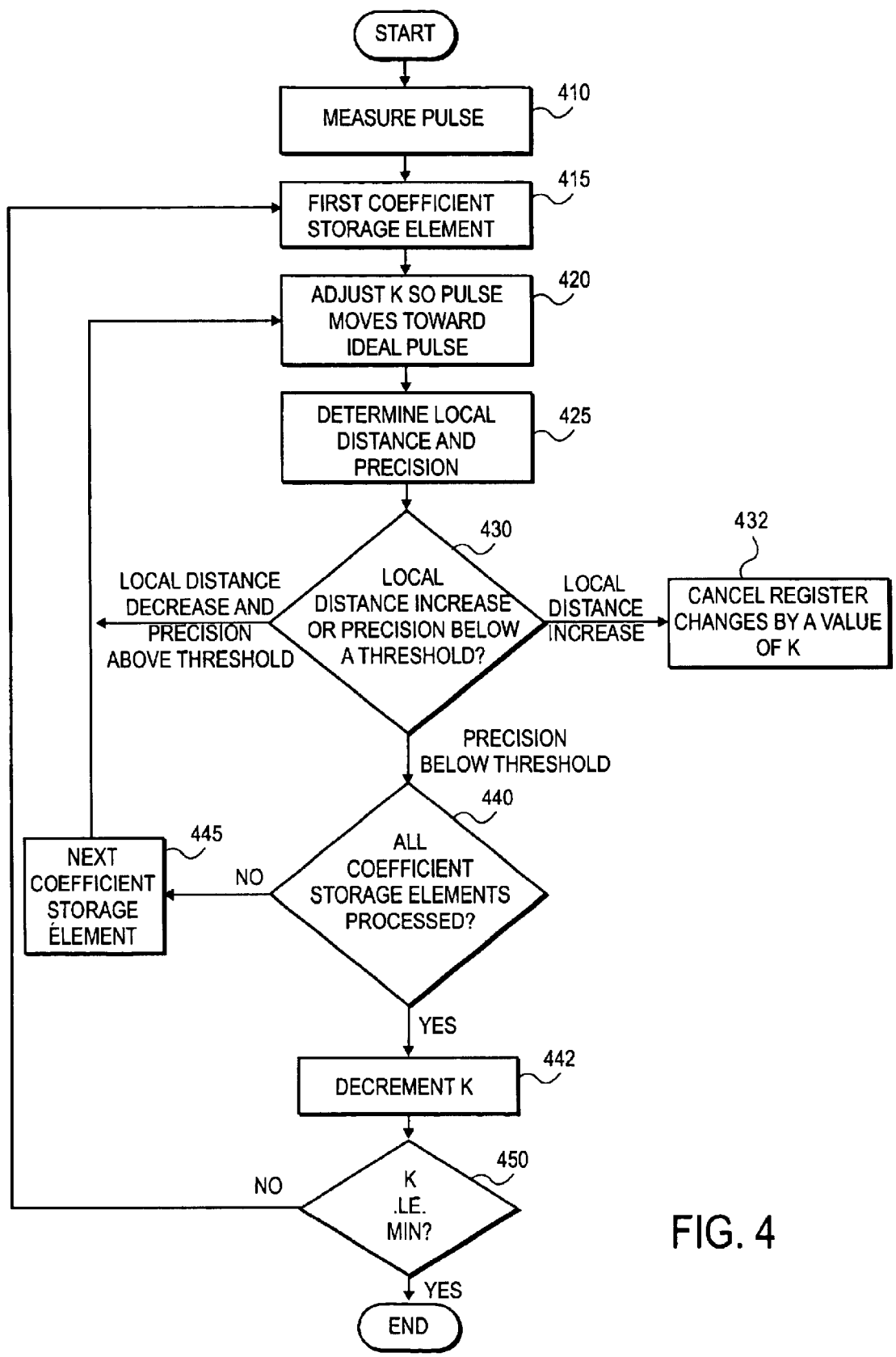
FIG. 4 is a simplified flow diagram of an alternate embodiment of the method of the present invention.

FIG. 4 illustrates one embodiment of an automated process for modifying an input pulse shape to correspond to an ideal pulse shape. At step 410 the input signal pulse is measured. In one embodiment a smooth pulse is measured by acquiring the input pulse shape using an average of a plurality of input signal pulses. In one embodiment, using the graphical user interface of FIG. 2, this may be performed by selection of the Acquire Signal button 250. Alternately, this may be automatically performed as part of the automated process, for example, a process selected by selecting the auto matching button 220. The pulse shape may alternately be determined using sampling, peak detection envelope detection or other processes for determining pulse shape as known to those skilled in the art. The determination of the input pulse shape may be performed by a pulse signal measuring device such as an oscilloscope or similar device.

In one embodiment, the ideal pulse is determined. The ideal pulse may be created based on certain criteria such as a pulse template. For example, the pulse template itself may be specified from a standard such as an ANSI standard, but an ideal Pulse that should fall between the bounds of a pulse template can be created as a curve in the middle of the template bounds. Alternately, the ideal pulse may be a stored predetermined value simply accessed and reference during processing. The ideal pulse in one embodiment is placed in the center of the pulse template for subsequent analysis, although in alternate embodiments it may be place in other locations relative to the input signal shape and/or pulse template.

Starting with a first coefficient register or storage element, step 415, the coefficient register value is adjusted by a value of k with the intention of moving the input signal pulse towards the ideal pulse, step 420. The variable k is adjusted such that the pulse is moved towards the ideal pulse. The value of k may be a fixed or an adjustable value. In one embodiment, k is adjustable, for example k=delta*constant wherein the value of k is proportionate to the difference between the pulse and the ideal pulse at the current coefficient location. Alternately, for example, the variable k may be initialized to a fixed value, for example 3, and decremented by a value, for example a value of 1, thereafter.

A location along the signal pulse may be used to measure the pulse and ideal pulse difference and determine whether to decrement or increment k. In one embodiment, the location is a prespecified location. In an alternate embodiment, the location corresponds to the horizontal location of the current coefficient register. Alternately, a reverse search may be performed for the exact coefficient location where each coefficient value has the most effect on the pulse shape by incrementing/decrementing the coefficient by a K integer (enough to cause a measurable signal change, i.e., more than noise between two separate measurements of the same signal. In one embodiment, k is selected such that it is less than a value of K. For example, a K value of 5 may be used for a T1/E1 short haul on an IXF3461.

At step 425, the local distance between the pulse and the ideal pulse at the horizontal location corresponding to the coefficient register is measured. For example, when processing coefficient register 6 (as illustrated in FIG. 3), the local distance is determined between the ideal pulse and input signal pulse at the horizontal location represented by the point at 216. In one embodiment, the local distance is the area between the pulse and ideal pulse in 3 Unit Intervals (UI). Other possible measurements include an absolute difference at one or more points of the pulse shape, smaller or larger UI area at one or more points, or the number of points above and/or below the ideal Pulse.

At step 430, if the local distance decreases and the precision is above a precision threshold, the process returns to step 420 where k is adjusted so that the pulse moves further towards the ideal pulse. Alternately, at step 430, if the precision is below a precision threshold the process continues at step 440. If the local distance increases, the register changes (i.e., changed by the value of k) are cancelled, step 432, and processing continues at step 440.

Thus, in one embodiment, this process reflected by steps 415, 420, 425, 430, continues so long as the local distance does not increase and the difference between the pulse and the ideal pulse at that particular coefficient location is more than predetermined precision, for example, k* precision (e.g., precision=0.01).

Once all the coefficients registers have been processed for a particular value of k, step 440, k is decremented, step 442 and the process is again performed, starting at step 415, for each coefficient register until k reaches a minimum k value that is just above the signal noise level, step 450. For example, a value of 0 may be used.

Figure 5:
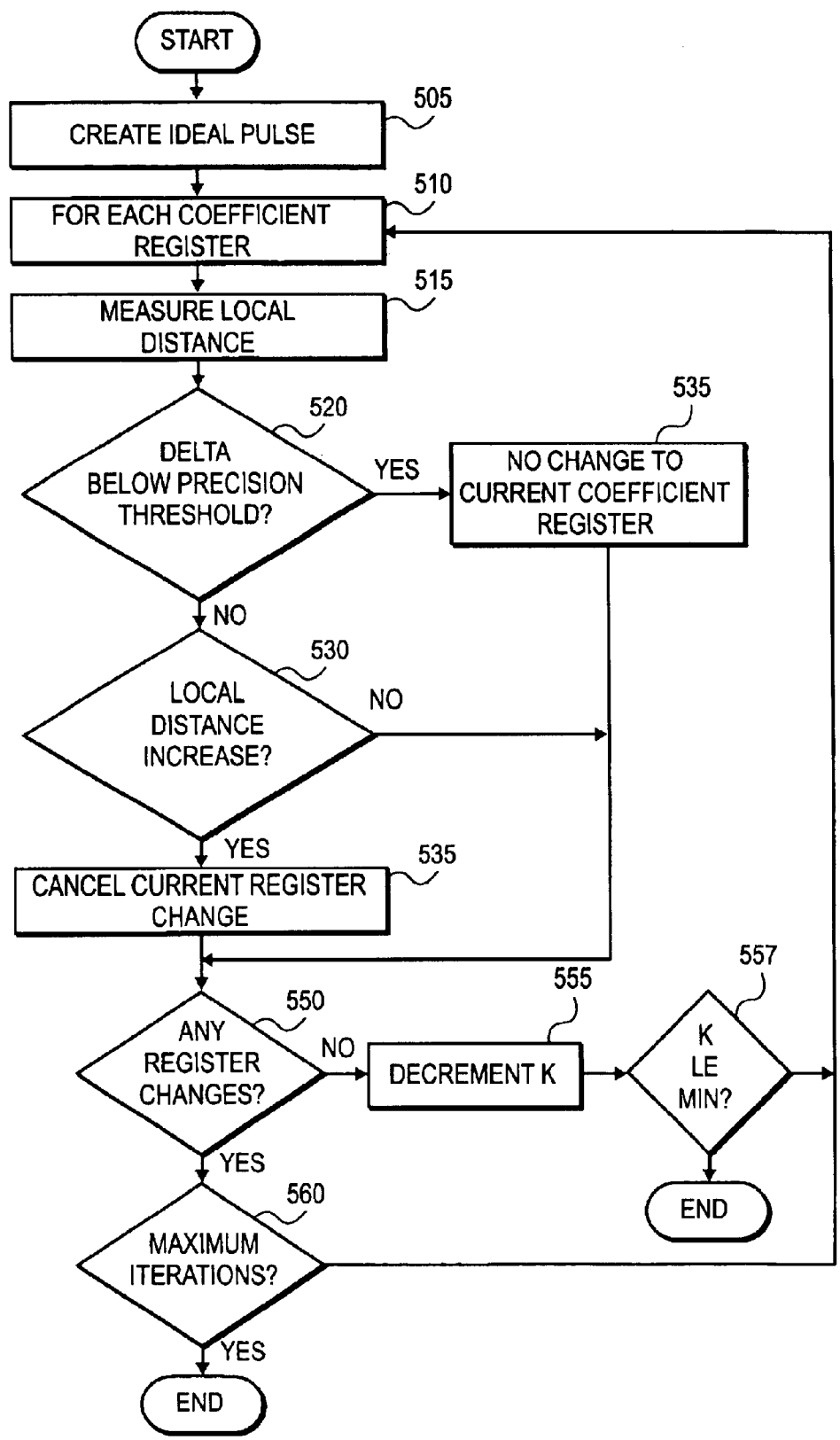
FIG. 5 illustrates an alternate embodiment of the method of the present invention.

FIG. 5 illustrates an alternate embodiment of the process of the present invention in which the registers are processed in a parallel manner. At step 505, the input pulse shape is measured. For each coefficient register, step 510, steps 515, 520, 525 530 and 535 are selectively performed in a parallel manner. In an alternate embodiment these steps may be performed serially, i.e., each coefficient register in sequence, or partially in parallel.

At step 515, the local distance is determined. In one embodiment, the local distance is determined using the coefficent location where the coefficient has the most effects of the pulse. In one embodiment, this may be determined by incrementing/decrementing the coefficient by a K integer (enough to cause a measurable signal change, for example, more than noise between two separate measurements of the same signal). In one embodiment, this is achieved by performing a reverse search for the exact coefficient location where each coefficient has the most effect on the pulse shape. In one embodiment, this is accomplished incrementing/decrementing the coefficient by a predetermined variable and measuring where the maximum difference in pulse shape amplitude change occurs.

If the difference between the pulse and the ideal pulse is less than a precision threshold, step 520, no change is made to the current coefficient register, step 525 and the process continues at step 550. In an alternate embodiment, the process may continue at step 530. If the difference is not less than the precision threshold, the process continues at step 530.

At step 530, if the local distance measure has increased, the current register changes are cancelled, step 535, and the process continues at step 550. The portion of the process reflected by steps 515, 520, 525 and 535 continues until all registers are processed. At step 550, if any of register values changed, k is decremented step 555, and it is determined whether it is above a minimum value reflective of the signal noise level. For example, k may be compare to a value of zero. If k is equal to zero, the process ends. If k does not equal zero the process again begins again at step 510.

If there are any register changes, step 550, and a maximum number of iterations have been performed, step 560, the process ends. Otherwise, the process continues at step 510 in order to best match the input signal shape to the ideal signal pulse shape. The maximum number of iterations can be a variety of deterministic values including a prespecified, adjustable or signal type specific value.

Alternate embodiments are also contemplated. For example, using the ideal pulse as a guide, the coefficient registers processed are those that correspond to locations where the ideal pulse has abrupt changes or coefficient registers corresponding to endpoint locations. The remaining coefficient register are updated by interpolation. In this embodiment, line segment approximation to the ideal pulse may be performed. Other alternatives include quadrature or other higher power approximation.

The invention has been described in conjunction with the preferred embodiment. It is evident that numerous alternatives, modifications, variations and uses will be apparent in light of the foregoing description.

What is claimed is:

1. A method comprising:

creating a visual representation of a pulse shape;

moving portions of the visual representation of the pulse shape to correspond to a visual representation of an ideal pulse; and updating at least one pulse shape coefficient storage element to represent the visual representation of the pulse shape such that the pulse shape is adjusted to correspond to the ideal pulse.

2. The method as set forth in claim 1, wherein moving portions comprises graphically moving selected portions of the pulse shape on a display device.

3. The method as set forth in claim 1, wherein moving portions comprises selectively modifying at least one coefficient storage element and displaying a modified pulse shape reflecting the modified coefficient register.

4. The method as set forth in claim 1, wherein moving portions comprises using at least one slide bar to modify the pulse shape.

5. The method as set forth in claim 1, further comprising selectively automatically matching the pulse shape to the pulse template.

6. The method as set forth in claim 1, wherein creating a visual representation of a pulse shape comprises receiving a signal pulse, storing at least one value in at least one coefficient storage element reflective of a pulse shape of the received signal pulse, and displaying the visual representation of the pulse shape in accordance with the values stored in the at least one coefficient storage element.

7. The method as set forth in claim 2, further comprising creating a visual representation of the ideal pulse and displaying the ideal pulse on the display device.

8. The method as set forth in claim 1, wherein the ideal pulse is selected from the group consisting of an ideal pulse shape, a selected pulse shape, an ideal pulse determined from a pulse template.

9. An apparatus comprising:
a display to display a visual representation of a pulse shape of a pulse signal;
an input to modify at least one portion of the visual representation of the pulse shape to correspond to a visual representation of an ideal pulse;
at least one coefficient storage element to store values representative of the visual representation of the pulse shape.

10. The apparatus as set forth in claim 9, further comprising an output to transfer the at least one coefficient storage element values to corresponding coefficient registers of a target system generating the pulse signals, the target system using the values the coefficient registers to form the pulse shape of signals transmitted by the target system.

11. The apparatus as set forth in claim 9, further comprising a signal input to receive the pulse signal, the pulse signal generated by a target system and comprises transmission effects on the pulse signal.

12. The apparatus as set forth in claim 11, wherein the transmission effects are selected from the group consisting of simulated transmission effects and effects generated by a wire coupled between the target system and the signal input.

13. The apparatus as set forth in claim 9, wherein the apparatus is selected from the group consisting of a signal diagnostic device, an oscilloscope and a computer system.

14. The apparatus as set forth in claim 9, wherein the display comprises a graphical user interface (GUI), the GUI comprising:
a signal display area to display the pulse shape and the ideal pulse;
control buttons to perform specified functions with respect to a pulse shape modification process; and
a user controlled-graphical icon to enable a user to select control buttons and modify the pulse shape.

15. The apparatus as set forth in claim 14, wherein the control buttons are selected from the group consisting of acquiring a signal, reading coefficient storage elements, writing coefficient storage elements, transferring coefficient storage elements contents to corresponding coefficient registers, and automatically matching the pulse shape to the ideal pulse.

16. The apparatus as set forth in claim 14, wherein the GUI further comprises at least one slider to modify coefficient values corresponding to the displayed pulse shape.

17. The apparatus as set forth in claim 9, further comprising logic to selectively automatically match the pulse shape to the ideal pulse.

18. The apparatus as set forth in claim 17, wherein the logic is selected from the group consisting of hardware, firmware and software.

19. The apparatus as set forth in claim 9, wherein the ideal pulse is selected from the group consisting of an ideal pulse shape, a selected pulse shape, an ideal pulse shape determined, from a pulse template.

20. A method comprising:
receiving a signal pulse having a current pulse shape;
formulating a local distance between the current pulse shape and an ideal pulse shape;
determining a local distance between the current pulse shape the ideal pulse shape;
adjusting at least one pulse shape variable such that the current pulse shape moves towards a shape of the ideal pulse, said adjusting performed so long as the local distance continues to decrease;
if the local distance increases, reversing the adjustment of the at least one pulse shape variable;
if the at least one pulse shape variable corresponds to a specified value indicative of a match between the current pulse shape and the ideal pulse, updating at least coeffcient storage element with coefficient values corresponding to the adjusted current pulse shape.

21. The method as set forth in claim 20, wherein adjusting, decrementing and updating is performed for each coefficient storage element.

22. The method as set forth in claim 20, wherein determining a local distance comprises measuring the distance between the pulse shape and the ideal pulse shape.

23. The method as set forth in claim 22, wherein the distance measured is between points selected from the group consisting of points corresponding to the location of a coefficient storage element, a predetermined location along the shapes, a location determined as most affected by change of the coefficient values.

24. The method as set forth in claim 20, wherein adjusting comprises incrementing a coefficient location where each coefficient has an effect of a specified level on the current pulse shape.

25. The method as set forth in claim 20, further comprising:
selectively processing coefficient storage elements corresponding to endpoints of the ideal pulse shape or abrupt changes in the ideal pulse shape; and
interpolating values for remaining coefficient storage elements using the values of the coefficient storage selectively processed.

26. A computer readable medium comprising instructions which when executed by a processor perform a method comprising:
creating a visual representation of a pulse shape;
moving portions of the visual representation of the pulse shape to correspond to a visual representation of an ideal pulse shape; and
updating at least one pulse shape coefficient storage element to represent the visual representation of the pulse shape such that the pulse shape is adjusted to correspond to the ideal pulse shape.

27. The computer readable medium as set forth in claim 26, wherein moving portions comprises graphically moving selected portions of the pulse shape on a display device.

28. The computer readable medium as set forth in claim 26, wherein moving portions comprises selectively modifying at least one coefficient element and displaying a modified pulse shape reflecting the modified coefficient storage element.

29. The computer readable medium as set forth in claim 26, wherein moving portions comprises selectively modifying at least one coefficient storage element and displaying a modified pulse shape reflecting the modified coefficient element.

30. The computer readable medium as set forth in claim 26, wherein moving portions comprises using at least one slide bar to modify the pulse shape.

31. The computer readable medium as set forth in claim 26, further comprising, instructions, which when executed, selectively automatically matching the pulse shape to the ideal pulse shape.

32. The computer readable medium as set forth in claim 26, wherein creating a visual representation of a pulse shape comprises receiving a signal pulse, storing at least one value in at least one coefficient storage element reflective of a pulse shape of the received signal pulse, and displaying the visual representation of the pulse shape in accordance with the values stored in the at least one coefficient storage element.

33. The computer readable medium as set forth in claim 26, further comprising instructions, which when executed, create a visual representation of the pulse template and display the pulse template on the display device.

34. The computer readable medium as set forth in claim 26, wherein the ideal pulse shape is selected from the group consisting of a selected pulse shape, an ideal pulse shape located in the center of a pulse template and a selected pulse shape located in the center of the pulse template.

* * * * *

UNITED STATES PATENT AND TRADEMARK OFFICE
CERTIFICATE OF CORRECTION

PATENT NO. : 6,748,336 B2  Page 1 of 1
DATED : June 8, 2004
INVENTOR(S) : Li

It is certified that error appears in the above-identified patent and that said Letters Patent is hereby corrected as shown below:

Title page,
Item [57], ABSTRACT,
Line 2, delete ". points" and insert -- . Points --.

Column 1,
Line 19, delete "Company" and insert -- Component --.

Signed and Sealed this

Thirty-first Day of August, 2004

JON W. DUDAS
*Director of the United States Patent and Trademark Office*